United States Patent
Yamazaki et al.

(10) Patent No.: US 8,957,462 B2
(45) Date of Patent: Feb. 17, 2015

(54) SEMICONDUCTOR DEVICE COMPRISING AN N-TYPE TRANSISTOR WITH AN N-TYPE SEMICONDUCTOR CONTAINING NITROGEN AS A GATE

(75) Inventors: Shunpei Yamazaki, Tokyo (JP); Hiromichi Godo, Kanagawa (JP); Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 48 days.

(21) Appl. No.: 13/314,326

(22) Filed: Dec. 8, 2011

(65) Prior Publication Data

US 2012/0146109 A1  Jun. 14, 2012

(30) Foreign Application Priority Data

Dec. 9, 2010  (JP) ................. 2010-274262

(51) Int. Cl.
| | | |
|---|---|---|
| H01L 29/76 | (2006.01) | |
| H01L 29/10 | (2006.01) | |
| H01L 29/66 | (2006.01) | |
| H01L 29/78 | (2006.01) | |
| H01L 21/265 | (2006.01) | |

(52) U.S. Cl.
CPC ........ H01L 29/1083 (2013.01); H01L 29/6659 (2013.01); H01L 29/7833 (2013.01); H01L 21/26586 (2013.01)
USPC .................................. 257/288; 257/E29.255

(58) Field of Classification Search
USPC ............... 257/402, 408, E29.268, E21.437, 257/E21.427, E29.04, E29.063; 438/286, 438/305
See application file for complete search history.

(56) References Cited

U.S. PATENT DOCUMENTS

| 4,656,492 A | * | 4/1987 | Sunami et al. ............. 257/336 |
| 5,245,207 A | * | 9/1993 | Mikoshiba et al. ......... 257/402 |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Kiyoshi Takeuchi et al. "Channel Engineering for the Reduction of Random-Dopant-Placement-Induced Threshold Voltage Fluctuation"; IEDM 97: Technical Digest of International Electron Devices Meeting; 1997; pp. 841-844.

(Continued)

*Primary Examiner* — Yu-Hsi D Sun
*Assistant Examiner* — Christina Sylvia
(74) *Attorney, Agent, or Firm* — Fish & Richardson P.C.

(57) ABSTRACT

A semiconductor device such as a transistor with an excellent OFF characteristic even when a channel is short is provided. A periphery of a source is surrounded by an extension region and a halo region, a periphery of a drain is surrounded by an extension region and a halo region, and a substrate with low impurity concentration is not in contact with the source or the drain. Moreover, a high-work-function electrode is provided via a gate insulator, and electrons entering the vicinity of a surface of the substrate from the extension regions are eliminated. With such a structure, the impurity concentration of the channel region can be decreased even when the channel is short, and a favorable transistor characteristic can be obtained.

15 Claims, 7 Drawing Sheets

(56) References Cited

U.S. PATENT DOCUMENTS

| | | |
|---|---|---|
| 5,364,807 A | 11/1994 | Hwang |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0008444 A1* | 1/2003 | Snyder .................. 438/197 |
| 2003/0189401 A1 | 10/2003 | Kido et al. |
| 2003/0215992 A1* | 11/2003 | Sohn et al. ............ 438/199 |
| 2003/0218222 A1 | 11/2003 | Wager, III et al. |
| 2004/0038446 A1 | 2/2004 | Takeda et al. |
| 2004/0110351 A1* | 6/2004 | Narasimha ............ 438/302 |
| 2004/0127038 A1 | 7/2004 | Carcia et al. |
| 2004/0227186 A1* | 11/2004 | Saito et al. ............ 257/347 |
| 2005/0017302 A1 | 1/2005 | Hoffman |
| 2005/0148133 A1* | 7/2005 | Chen et al. ............ 438/199 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0290264 A1 | 12/2007 | Sugii et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128517 A1* | 6/2008 | Yukawa et al. ............ 235/492 |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0185635 A1* | 8/2008 | Yanagi et al. ............ 257/325 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250755 A1 | 10/2009 | Ohmi et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0097942 A1 | 4/2012 | Imoto et al. |
| 2012/0098072 A1* | 4/2012 | Han et al. ............ 257/402 |
| 2012/0112184 A1 | 5/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

John Robertson; "Band offsets of wide-band-gap oxides and implications for future electronic devices"; J. Vac. Sci. Technol. B (Journal of Vacuum Science & Technology B); 2000; pp. 1785-1791; vol. 18, No. 3.

R.E. Jones et al.; "Evidence for p-Type Doping of InN"; 2006; pp. 125505-1-125505-4; vol. 96.

Masaki Nakamura et al.; "The Phase Relations in the In2O3—Ga2ZnO4—ZnO System at 1350° C"; Journal of Solid State Chemistry; 1991; pp. 298-315; vol. 93.

R.E. Jones et al.; "Evidence for p-Type Doping of InN"; 2006; Physical Review Letters, pp. 125505-1-125505-4; vol. 96.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16TH International Display Workshops, 2009, pp. 689-692

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

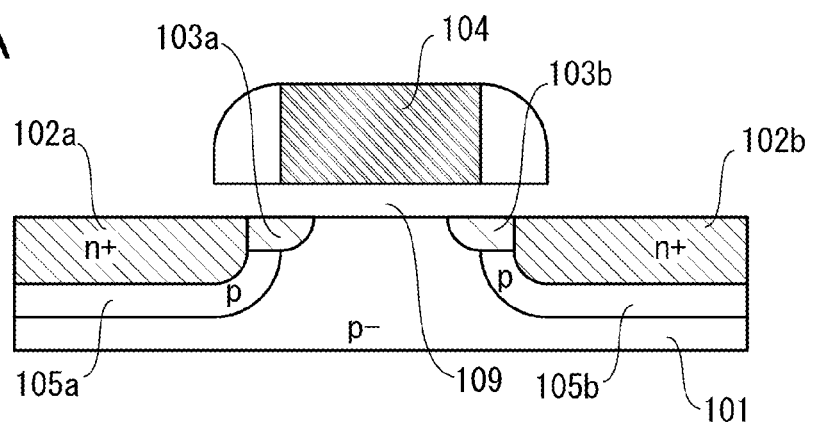
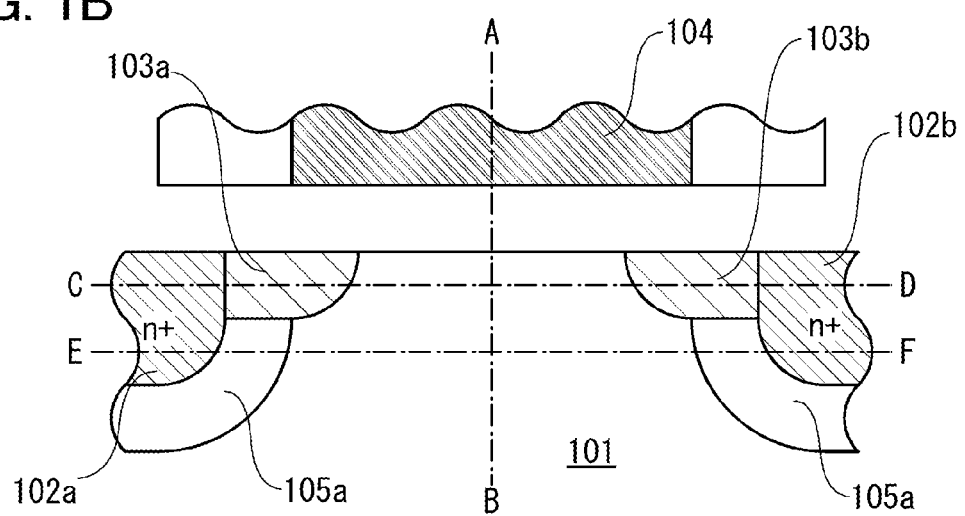
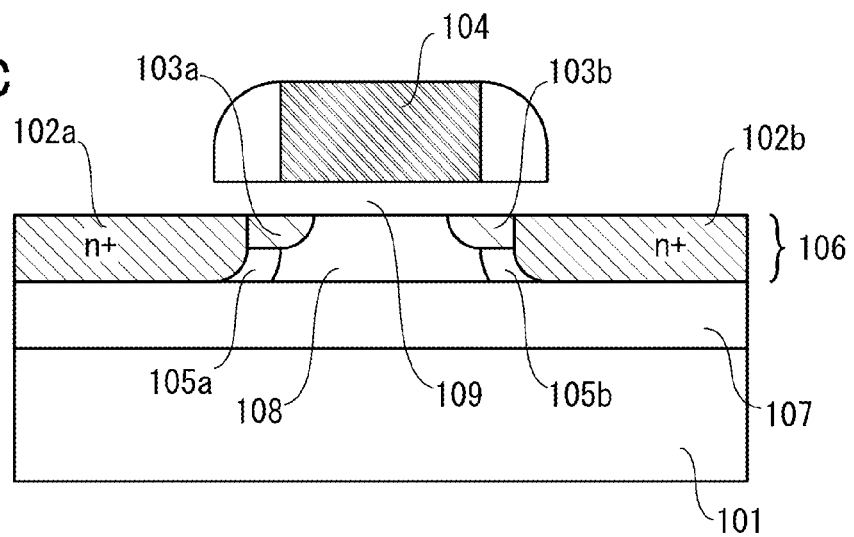

SEMICONDUCTOR DEVICE COMPRISING AN N-TYPE TRANSISTOR WITH AN N-TYPE SEMICONDUCTOR CONTAINING NITROGEN AS A GATE

BACKGROUND OF THE INVENTION

1. Field of the Invention

The present invention relates to a semiconductor device including a semiconductor, such as a transistor or a diode.

2. Description of the Related Art

A silicon insulated gate field effect transistor (hereinafter referred to as a transistor), which has been widely used for an integrated circuit or the like, has come to have some prominent problems along with the miniaturization of the circuit. The most problematic subject is the short-channel effect. The short-channel effect is phenomena that the threshold value shifts to the negative direction (the threshold value decreases) for an n-channel type transistor, and that the subthreshold characteristic is degraded (the subthreshold value increases).

The insulation of the transistor in an OFF state is maintained by formation of pn junctions between a source and a channel region and between the channel region and a drain. When the channel length becomes substantially the same as or less than the thickness of the pn junction (or the thickness of a depletion layer formed within the pn junction), the insulation due to the pn junctions is no longer sufficient; therefore, the problems as above occur.

When the channel length is set to be, for example, 1/k, it is necessary that the concentration of impurities, such as donors or acceptors, in the channel region be set k times and the thickness of a gate insulator be set 1/k in order to suppress the short-channel effect.

However, when the impurity concentration is increased or the gate insulator is thinned as above, other problems occur. First, an increase in impurity concentration causes the carrier mobility to decrease, which results in a problem in current drive capability. For example, when the channel region has an impurity concentration of $1 \times 10^{15}$ cm$^{-3}$, the electron mobility is 1400 cm$^2$/Vs or more; however, when the channel region has an impurity concentration of $1 \times 10^{19}$ cm$^{-3}$ or more, the electron mobility is decreased down to approximately 100 cm$^2$/Vs.

Further, when the channel region becomes miniaturized, a variation in threshold value due to the statistical fluctuation of impurities contained in the channel region (see Non-Patent Document 1) becomes unignorable. It is known that the variation in threshold value is proportional to the square root of (the impurity concentration×the thickness of the depletion layer/the area of the channel region), and the variation in threshold value will drastically increase due to an increase in impurity concentration and a decrease in channel area resulting from the channel shortening.

Since the variation in threshold value is inversely proportional to the dielectric constant of the gate insulator and is proportional to the physical thickness thereof, the variation can be suppressed by the use of a thin gate insulator having high dielectric constant; however, there is limitation on the use of a high-dielectric-constant material and on the thinning of the gate insulator.

For example, thinning the gate insulator leads to an increase in leakage current between the gate and the channel region. In particular, in a case of using silicon oxide for the gate insulator, when the thickness is 2 nm or less, the leakage current due to tunnel current will suddenly increase, so that power consumption will suddenly increase.

Further, in a case of an N-channel type transistor whose gate has been formed using n-type polycrystalline silicon having high impurity concentration, when a positive potential is applied to the gate, its portion in the vicinity of the gate insulator (ranging from 0.2 nm to 0.5 nm in thickness) becomes depleted, which results in that the effective thickness of the gate insulator becomes large. This becomes a serious problem when the thickness of the gate insulator is 2 nm or less.

Palliative solutions have been suggested with respect to these problems but no essential solutions have been found yet. For example, as for the thickness of the gate insulator, a material having a higher dielectric constant than silicon oxide (high-k material) is used for the gate insulator. As for the short-channel effect, the high-k material can provide substantially the same effect as the thin gate insulator of silicon oxide even when the physical thickness of the gate insulator is increased.

However, as a result of comparison of the energy difference between the bottom of the conduction band of silicon and the bottom of the conduction band of an insulator, that of hafnium oxide is approximately 1.5 eV and there are no other materials that surpass silicon oxide (3.5 eV); therefore high-k materials are generally disadvantageous in terms of electrical insulation (see Non-Patent Document 2).

Further, as shown in FIG. 2A, a method has been suggested in which the impurity concentration of the channel region is maintained to be low by forming regions with relatively high impurity concentration (halo regions 205a and 205b) in the vicinity of a source 202a and a drain 202b (see Patent Document 1). However, it cannot be said that this is an effective means for a short channel length of 100 nm or less.

For example, in the case where the channel length is 50 nm or less, it is necessary to suppress the outflow of carriers from extension regions 203a and 203b in the vicinity of the channel region. Along with the shortening of the channel, the impurity concentration of the extension regions 203a and 203b increases. In order to suppress the carrier injection from the extension regions 203a and 203b, it becomes necessary to also increase the concentration of the halo regions 205a and 205b. Specifically, in the case where the channel length is 50 nm or less, the impurity concentration of each of the halo regions 205a and 205b is required to be $5 \times 10^{18}$ cm$^{-3}$ or more.

Needless to say, in the structure shown in FIG. 2A, the carriers flowing between the source and the drain move from the extension region 203a to the extension region 203b through the halo regions 205a and 205b having high impurity concentration. When the regions with high impurity concentration exist in the route, impurity scattering is large; therefore, the mobility decreases.

In addition, the existence of the regions with high impurity concentration in the route increases the aforementioned variation in threshold value. Further, ion implantation at an oblique angle to the gate is necessary for forming the halo regions 205a and 205b outside the extension regions 203a and 203b. It is reported that, in this process, the gate insulator near the gate edge is damaged due to high-speed ions and the trap levels increase.

Boron is often used as a p-type impurity for forming the halo regions or the like. Actually, it is not an exaggeration to say that there are no practical p-type impurities other than boron. However, boron is easy to diffuse due to its small ionic radius and boron ions are very widely distributed at the time of ion implantation due to its small atomic weight. Specifically, boron exhibits a transient enhanced diffusion characteristic, and it is known that boron diffuses abnormally during thermal activation.

Considering the properties of boron as above, it is extremely difficult to provide the impurity region with steep concentration distribution by using boron. Therefore, in fact, boron is implanted even to the channel region at a concentration of $5\times10^{18}$ cm$^{-3}$ or more besides the halo regions 205a and 205b.

As a method for decreasing the impurity concentration without the use of the halo region and suppressing the short-channel effect, as shown in FIG. 2B, a fully depleted transistor having a silicon-on-insulator (SOI) structure has been suggested in which a buried insulator 307 is formed extremely thinly, a channel region 308 having extremely low impurity concentration is provided in an SOI layer 306 provided over the buried insulator 307, and the channel region 308 is depleted by applying bias from a semiconductor substrate 301 below the buried insulator 307 (see Patent Document 2).

In order to deplete the channel region with bias from the substrate 301 in this manner, the thickness of each of the SOI layer 306 and the buried insulator 307 needs to be 20 nm or less; however, it is technically very difficult to form the SOI layer 306 and the buried insulator 307 with such a small thickness. From the perspective of mass productivity, the thickness of each of the SOI layer 306 and the buried insulator 307 is preferably 50 nm or more; however, the transistor shown in FIG. 2B does not sufficiently operate under such a condition.

On the other hand, as for the depletion of the gate, as shown in FIG. 2C, a method in which p-type silicon is used for a gate 404 in an accumulation type transistor with an SOI structure or a method in which a p-type silicon layer or a p-type silicon substrate 401 is provided for a side opposite to the gate 404 via a buried insulator 407 with a thickness of 20 nm or less has been suggested (see Patent Document 3).

However, boron is used as the p-type impurity also in this case. Therefore, as aforementioned, when boron-added silicon is used for the gate 404, particularly in the case where the physical thickness of the gate insulator is 2 nm or less, boron diffuses even to the channel region 408 through the gate insulator, which causes the variation in threshold value of the transistor. Moreover, when boron is implanted to the SOI substrate through the channel region by an ion implantation method, as a matter of course, a large amount of boron is implanted to the channel region 408, which also causes the variation in threshold value.

Also in this case, the thickness of the SOI layer 406 needs to be much smaller than the channel length, and specifically needs to be 20 nm or less, which is an obstacle in terms of mass productivity.

REFERENCES

Patent Documents

[Patent Document 1] U.S. Pat. No. 5,364,807
[Patent Document 2] United States Patent Application Publication No. 2007/0290264
[Patent Document 3] United States Patent Application Publication No. 2009/0250755

Non-Patent Documents

[Non-Patent Document 1] K. Takeuchi et al., "*Channel Engineering Or the Reduction of Random-Voltage-Induced Threshold Voltage Variation*", p. 841, IEDM (1997).
[Non-Patent Document 2] John Robertson, "*Band offsets of wide-band-gap oxides and implications for future electronic devices*" Journal of Vacuum Science and Technology B, 18 p. 1785 (2000).
[Non-Patent Document 3] R. E. Jones et al., "*Evidence for p-Type Doping of InN*", Phys. Rev. Lett. 96, p. 125505 (2006).
[Non-Patent Document 4] M. Nakamura et al., "*The Phase Relations in the $In_2O_3$—$Ga_2ZnO_4$—$ZnO$ System at 1350° C.*", J. Solid State Chem., Vol. 93, pp. 298-315 (1991).

SUMMARY OF THE INVENTION

It is an object of the present invention to provide a novel semiconductor device (such as a transistor) in which the short-channel effect can be suppressed even when the semiconductor device is miniaturized, a variation in threshold value is small, and the gate leakage current is sufficiently suppressed.

It is another object of the present invention to provide a novel semiconductor device (specifically a transistor). It is another object to provide a novel method for driving a semiconductor device (specifically a novel method for driving a transistor). It is another object to provide a novel method for manufacturing a semiconductor device (specifically a novel method for manufacturing a transistor).

Moreover, it is an object of the present invention to provide a semiconductor device (specifically a transistor) which has improved performance or consumes less electric power. It is another object to provide a method for driving a semiconductor device which has improved performance or consumes less electric power (specifically a method for driving a transistor). It is another object to provide a method for manufacturing a semiconductor device which has improved performance or consumes less electric power (specifically a method for manufacturing a transistor). At least one of the above-described objects is achieved by the present invention.

The present invention will be described below. In the specification, when one of a source and a drain of a transistor is called a drain, the other is called a source. That is, they are not distinguished depending on the potential level. Therefore, a portion called a source in this specification can be alternatively referred to as a drain.

A channel region in the description below corresponds to a semiconductor region near the region where a channel is formed between extension regions. Therefore, in some cases, one channel region contains plural impurity regions with plural conductivity types or plural concentrations. Further, there are some cases where a channel region constitutes a part of a substrate. A channel length refers to the distance between the extension regions.

An aspect of the present invention is a semiconductor device including a channel region, a gate insulator provided over the channel region, and an n-type semiconductor which is provided in contact with the gate insulator and which contains nitrogen and at least one of indium, tin, and zinc, wherein a threshold value is +1.5 V or more.

An aspect of the present invention is a semiconductor device including an n-type semiconductor with a high work function which is provided in contact with a gate insulator and which contains nitrogen and at least one of indium, tin, and zinc, wherein a relation of $N_d^{1/2} \times t_{ox} \times L < 1$ [nm$^{1/2}$] is satisfied where $N_d$ [nm$^{-3}$] ($N_d < 1 \times 10^{-3}$) is the concentration of impurities (donors and acceptors) in a channel region, $t_{ox}$ [nm] is the thickness of the gate insulator when it is assumed as silicon oxide (i.e., the equivalent oxide thickness or EOT, hereinafter also referred to as simply the thickness of the gate insulator), and L [nm] is the channel length.

Note that a unit of $nm^{-3}$ is used as the impurity concentration here in particular, and $1\ nm^{-3}$ is equal to $1 \times 10^{21}\ cm^{-3}$. The impurity concentration in this case is the average impurity concentration between the extension regions, and for example, in the case where the halo regions 205a and 205b are provided between the extension regions 203a and 203b as in the transistor shown in FIG. 2A, the amount of the impurities contained therein is also taken into consideration.

Note that the impurity type may be either n-type or p-type as long as the impurity concentration is $1 \times 10^{15}\ cm^{-3}$ or less. N-type impurities of the concentration of $1 \times 10^{18}\ cm^{-3}$ or less within 20 nm from a surface of the channel region or within a region to the depth of the extension region may be used.

For example, the above relation is satisfied when the transistor has an impurity concentration of the channel region of $1 \times 10^{15}\ cm^{-3}$, a channel length of 50 nm, and a thickness of the gate insulator of 10 nm. Moreover, the above relation is satisfied when the transistor has an impurity concentration of the channel region of $1 \times 10^{17}\ cm^{-3}$, a channel length of 50 nm, and a thickness of the gate insulator of 1 nm.

An aspect of the present invention is a semiconductor device including an extension region provided in contact with a channel region, a halo region provided in contact with the extension region and one of a source and a drain, and an n-type semiconductor with a high work function which is provided in contact with a gate insulator and which contains nitrogen and at least one of indium, tin, and zinc, wherein a relation of $N_d^{1/2} \times t_{ox} \times L < 1\ [nm^{1/2}]$ is satisfied where $N_d\ [nm^{-3}]$ is the concentration of impurities (donors and acceptors), $t_{ox}$ [nm] is the thickness of the gate insulator when it is assumed as silicon oxide, and L [nm] is the channel length.

An aspect of the present invention is a semiconductor device including a channel region with a channel length of 100 nm or less, a first impurity region with a first conductivity type which is in contact with the channel region and which has an impurity concentration of $1 \times 10^{19}\ cm^{-3}$ or more, a second impurity region with a second conductivity type which is in contact with the channel region and the first impurity region and which has an impurity concentration of $1 \times 10^{18}\ cm^{-3}$ or more, and an n-type semiconductor which is provided in contact with a gate insulator and which has a work function of 5.0 eV or more.

Here, the n-type semiconductor with a high work function which contains nitrogen and at least one of indium, tin, and zinc (hereinafter also referred to as a high-work-function compound semiconductor) needs to have a work function of 5.0 eV or more, desirably 5.5 eV or more. The high-work-function compound semiconductor contains nitrogen at a concentration of 5 at. % or more and 50 at. % or less. Further, the high-work-function compound semiconductor desirably contains zinc at a concentration of 5 at. % or more and 66.7 at. % or less, indium at a concentration of 5 at. % or more and 50 at. % or less, and/or tin at a concentration of 5 at. % or more and 57.1 at. % or less.

The high-work-function compound semiconductor may contain a metal element with an atomic number of 20 or less at a concentration of 1% or less, preferably 0.01% or less. The high-work-function compound semiconductor may contain oxygen or another metal element with an atomic number of 21 or more. The high-work-function compound semiconductor may contain hydrogen at a concentration of 0.01 at. % to 10 at. %.

The OFF characteristic is more favorable as the extension region is shallower; however, when the mass productivity and the conductivity are considered, it is not preferable to make the extension region excessively shallow. The depth of the extension region is preferably 5 nm to 20 nm although depending on the thickness of the gate insulator. The thickness of the high-work-function compound semiconductor is preferably set to 5 nm or more and 100 nm or less.

The high-work-function compound semiconductor is preferably a single crystal or polycrystalline body having a wurtzite-type crystal structure. In the case of the polycrystalline body, the c-axis is preferably approximately perpendicular to a plane forming the channel. That is, the angle between the c-axis and the plane forming the channel is preferably in the range from 85° to 90° in 90% or more of crystals constituting the high-work-function compound semiconductor.

The high-work-function compound semiconductor may have a hexagonal crystal structure other than the wurtzite type. In that case, a hexagonal lattice image is sometimes observed from the c-axis direction. The high-work-function compound semiconductor may have a cubic crystal structure.

The electron affinity of the above high-work-function compound semiconductor is 5.0 eV or more. Therefore, many of defect levels formed at levels which are 4 eV to 5 eV below the vacuum level (typically, the level which is 4.9 eV below the vacuum level, see Non-Patent Document 3) serve as donors; thus, the high-work-function compound semiconductor is an n-type semiconductor having an electron concentration of $1 \times 10^{19}\ cm^{-3}$ or more, preferably $1 \times 10^{20}\ cm^{-3}$ or more without particular doping treatment.

Indium nitride with a chemical formula InN is given as an example of the high-work-function compound semiconductor. Indium nitride is a semiconductor with a band gap of 0.7 eV or less and an electron affinity of 5.6 eV. It is known that indium nitride has a wurtzite type structure.

It is known that indium nitride having part of indium substituted by gallium or aluminum has a larger band gap and its degree depends on the proportion of the substituted part or the substituted element. In a similar manner, the work function can be decreased in accordance with the proportion of the substituted part or the substituted element.

For example, the electron affinity of a substance with a composition formula of $In_{0.9}Ga_{0.1}N$ is approximately 5.4 eV. In general, the electron affinity of a substance with a composition formula of $In_{1-a}Ga_aN$ is approximately (5.6-2a) [eV] (where a≤0.3).

Zinc nitride known as having a chemical formula of $Zn_3N_2$ is given as another example. The details of the physical values of zinc nitride have not been known; however, it has been clarified that the electron affinity thereof is approximately 5.5 eV It is known that zinc nitride has a cubic crystal structure.

Such a high-work-function compound semiconductor may be manufactured by known methods, such as a sputtering method, a vacuum evaporation method, an ion plating method, an MBE (molecular beam epitaxy) method, a CVD method (an MOCVD (metal organic CVD) method or an ALD (atomic layer deposition) method), or the like.

For example, when gallium indium nitride ($In_{1-a}Ga_aN$) is manufactured by an MOCVD method, trimethylindium (($CH_3)_3In$), trimethylgallium (($CH_3)_3Ga$), and ammonia may be used as source gases and the substrate temperature may be set to 350° C. to 550° C.

As aforementioned, the work function of the high-work-function compound semiconductor can be 5.0 eV or more, preferably 5.3 eV or more. This is higher than that of p-type silicon (work function is 5.15 eV); therefore, when the high-work-function compound semiconductor is provided in contact with the gate insulator, the electron state of the channel region is largely affected.

In a pn junction of a semiconductor, a depletion layer is formed in a boundary portion between a p-type region and an n-type region. In the case where each concentration is $1 \times 10^{19}$ cm$^{-3}$, the thickness of the depletion layer is 10 nm or less; for example, when the n-type region is used as the extension region and the p-type region is used as the channel region, a clear boundary can be formed even in a transistor with a channel length of 50 nm.

However, a lower impurity concentration of the channel region is preferable; therefore, if the impurity concentration of the p-type region is decreased to be $1 \times 10^{17}$ cm$^{-3}$, the depletion layer expands deeply into the p-type region, so that electrons are injected even to the portion at a distance of 100 nm from the boundary, whereby a region with high electron concentration is formed. In this state, the transistor has an insufficient OFF characteristic such that electrons can be easily moved between the extension regions of the transistor with a channel length of 50 nm.

Conventionally, a transistor having a channel region with a p-type impurity concentration of $1 \times 10^{17}$ cm$^{-3}$ and having a gate insulator with a thickness of 1 nm used to need a channel length of several hundreds of nanometers. That is, $N_d^{1/2} \times t_{ox} \times L$ is larger than 1 [nm$^{1/2}$]. Alternatively, in order to achieve a channel length of 50 nm, it has been necessary to increase the p-type impurity concentration to be $5 \times 10^{18}$ cm$^{-3}$ or more; in this case, $N_d^{1/2} \times t_{ox} \times L$ is still larger than 1 [nm$^{1/2}$].

When the thickness of the gate insulator is set to, for example, 0.5 nm, $N_d^{1/2} \times t_{ox} \times L$ is smaller than 1 [nm$^{1/2}$]. However, in consideration of the tunnel current, the physical thickness of the gate insulator is desirably 2 nm or more. That is, the conventional structure as shown in FIG. 2A cannot provide any transistor with the practical impurity concentration of the channel region $N_d$, the practical thickness of the gate insulator $t_{ox}$ and the practical channel length L which satisfies $N_d^{1/2} \times t_{ox} \times L < 1$ [nm$^{1/2}$].

In particular, when n-type silicon is used for the gate, electrons are induced to the channel surface; therefore, improvement is not achieved at all. On the other hand, when p-type silicon is used for the gate, holes are induced to the channel surface and conduction between the extension regions can be controlled to some extent. However, since p-type silicon contains a large amount of boron, there is a concern that boron passes through the gate insulator to diffuse into the channel region.

Meanwhile, the high-work-function compound semiconductor has high work function as described above; therefore, a function of inducing holes to the channel surface is larger and affects a deeper region. Further, the concentration of elements, including boron, which have a highly diffusing property (particularly metal elements with an atomic number of 20 or less) can be decreased; therefore, it is possible to suppress the diffusion of donors or acceptors into the channel region.

Moreover, according to an aspect of the present invention, the distance between the halo regions can be made larger than the distance between the extension regions. That is, the region to which boron is implanted (halo region) can be set away from a center portion of the channel region. Therefore, the concentration of boron in the channel region can be decreased further.

Such a high work function of the high-work-function compound semiconductor as above means that conduction between the extension regions can be sufficiently controlled even when the gate insulator is thicker. Typically, the EOT of the gate insulator can be set to 2 nm or more, preferably 5 nm or more. The gate insulator with such a thickness can eliminate the concern of the depletion of the gate.

In the first place, the depletion of the gate is caused by donors scattered in the semiconductor (gate). That is, the substantial thickness of the gate insulator is increased by the distance from the gate insulator to the donor which has been ionized due to the positive potential given to the gate.

As disclosed in Patent Document 3, when p-type silicon is used for a gate and a positive potential is given to the gate, holes appear at an interface with a gate insulator; therefore, the substantial thickness of the gate insulator does not change. In a similar manner, when donors concentrate on the interface with the gate insulator, the substantial thickness of the gate insulator does not change even when the donors are ionized.

In this regard, donors, particularly those due to defect levels concentrate on the vicinity of an interface in a high-work-function compound semiconductor (see Non-Patent Document 3). Therefore, even when a positive potential is given to a gate, an effect of depletion hardly appears. That is, in spite of the fact that the high-work-function compound semiconductor is an n-type semiconductor, an advantageous effect which is equal to or greater than that of p-type silicon can be obtained.

According to Non-Patent Document 3, the defect levels concentrate approximately 4.9 eV below the vacuum level. Therefore, an electron affinity of 4.9 eV or more is necessary in order for such defect levels to serve as donors, and an electron affinity of 5.3 eV or more is preferable in order to provide sufficient carrier concentration. The high-work-function compound semiconductor satisfies that condition.

When the gate insulator is made thick, there is a concern that the on-state current decreases. It is known that in general, the on-state current of a transistor is inversely proportional to the thickness of the gate insulator. However, according to an aspect of the present invention, the impurity concentration of the channel region can be decreased; therefore, even when the gate insulator is made thick, the on-state current hardly changes as compared with a conventional one.

This is because the on-state current is also proportional to the mobility and the mobility can be maintained to be high according to an aspect of the present invention; therefore, a decrease due to the increase in thickness of the gate insulator can be offset. The conventional transistor shown in FIG. 2A, in the case of having a channel length of 50 nm, has an average impurity concentration of the channel region of approximately $5 \times 10^{18}$ cm$^{-3}$. Then, the electron mobility decreases down to approximately 100 cm$^2$/Vs.

On the other hand, according to an aspect of the present invention, the impurity concentration of the channel region can be made $1 \times 10^{17}$ cm$^{-3}$ or less. Here, the electron mobility is 800 cm$^2$/Vs or more, which is 8 times or more that of the conventional transistor. According to an aspect of the present invention, the impurity concentration of the channel region can be further decreased to $1 \times 10^{15}$ cm$^{-3}$ or less; at this time, the electron mobility is 1400 cm$^2$/Vs or more, which is 14 times or more that of the conventional transistor.

Therefore, according to an aspect of the present invention, the on-state current is not inferior to that of the conventional transistor even when the gate insulator has a thickness 8 or more times, further 14 or more times, as large as that of the conventional transistor. For example, according to an aspect of the present invention, when the impurity concentration of the channel region is set to $1 \times 10^{17}$ cm$^{-3}$ or less, the on-state current becomes higher than that of the conventional transistor even when the gate insulator has a thickness 5 times as large as that of the conventional transistor.

The present invention does not hamper the use of a high-k material for the gate insulator and the above argument can apply even to the case where a high-k material is used for the gate insulator. The physical thickness of the gate insulator may be 4 times that of silicon oxide by using a material with a dielectric constant 4 times that of silicon oxide.

Further, the present invention does not preclude the gate insulator having a physical thickness of 2 nm or less. The physical thickness of the gate insulator may be determined depending on a required on-state current and a leakage current via the gate insulator, and the physical thickness of the gate insulator of a semiconductor device according to the present invention may be 1 nm or less.

In the structure where the high-work-function compound semiconductor is provided in close contact with the gate insulator as in the present invention, the channel region below is depleted in an OFF state; therefore, even if the gate insulator has a thickness of 2 nm or less, the insulation between the channel region and the gate can be sufficiently maintained.

Further, as aforementioned, in the case where the high-work-function compound semiconductor is bonded with the gate insulator, the donors of the high-work-function compound semiconductor concentrate on the vicinity of an interface; therefore, an effect of the depletion of the gate hardly appears and the physical thickness of the gate insulator may be set to 2 nm or less.

The threshold value of a transistor can be decreased when the channel region has an appropriate n-type impurity concentration. The threshold value of a transistor according to an aspect of the present invention changes depending on the conductivity type and impurity concentration of the channel region, and decreases as the conductivity type of the channel region changes from p type to intrinsic and intrinsic to n type.

For example, when the channel region is intrinsic silicon and the high-work-function electrode has a work function of 5.6 eV, the threshold value can be set to +1.5 eV or more. When a high threshold value is necessary, this combination can be used. The threshold value can be changed by doping the channel region with p- or n-type impurities at a concentration of $1 \times 10^{18}$ cm$^{-3}$ or less.

When the impurity concentration of the channel region is set to $1 \times 10^{18}$ cm$^{-3}$ or less, the variation in threshold value can be suppressed. As aforementioned, since the variation in threshold value can be more suppressed as the impurity concentration of the channel region is lower; therefore, the impurity concentration of the channel region is set to $1 \times 10^{17}$ cm$^{-3}$ or less, preferably $1 \times 10^{15}$ cm$^{-3}$ or less.

Advantageous effects of the present invention have been described so far. In order to obtain these effects, neither the excessively thin SOI layer nor the excessively thin buried insulator required in FIG. 2B or FIG. 2C is needed; however, it is needless to say that the present invention can be implemented in combination with those.

BRIEF DESCRIPTION OF THE DRAWINGS

In the accompanying drawings:

FIGS. 1A to 1C each show an example of a semiconductor device of the present invention;

DETAILED DESCRIPTION OF THE INVENTION

Figure 2A:
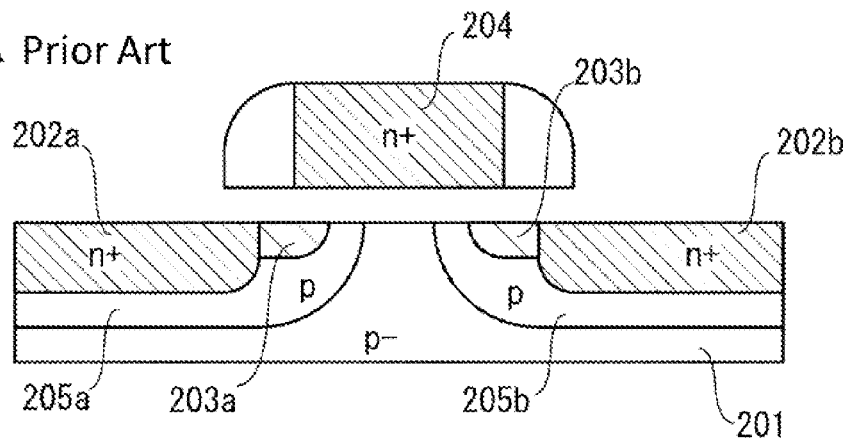
FIGS. 2A to 2C each show an example of a conventional semiconductor device.
Figure 2B:
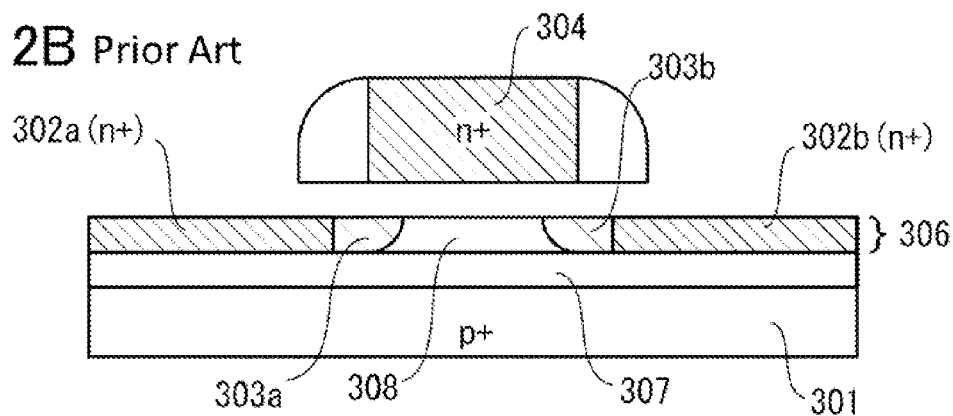
Figure 2C:
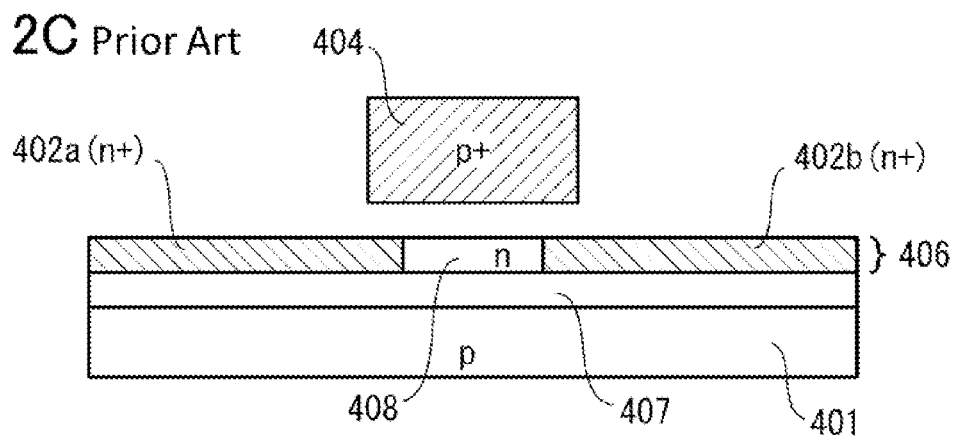

Embodiments will hereinafter be described with reference to drawings. However, the embodiments can be implemented with many different modes. It will be readily appreciated by those skilled in the art that modes and details can be changed in various ways without departing from the spirit and scope of the present invention. Therefore, the present invention should not be construed as being limited to the following description of the embodiments.

Embodiment 1

FIG. 1A illustrates an example of a semiconductor device in Embodiment 1. Here, a schematic cross-sectional view of a transistor in a channel direction is shown. The transistor includes a high-work-function electrode 104 including a high-work-function compound semiconductor with a thickness of 5 nm or more and 100 nm or less over a substrate 101 of a single-crystal semiconductor, and includes a gate insulator 109 with an appropriate thickness between the electrode 104 and the substrate 101.

The substrate 101 has p-type conductivity and has an impurity concentration of $1 \times 10^{18}$ cm$^{-3}$ or less, preferably $1 \times 10^{17}$ cm$^{-3}$ or less, and more preferably $1 \times 10^{15}$ cm$^{-3}$ or less. In the case where the impurity concentration is $1 \times 10^{15}$ cm$^{-3}$ or less, the substrate 101 may be an n-type single-crystal semiconductor.

The width of the high-work-function electrode 104, which is important in determining the channel length of the transistor, is set to 100 nm or less, preferably 50 nm or less, and more preferably 20 nm or less. The thickness of the gate insulator may be set to 2 nm to 10 nm.

The substrate 101 is provided with a source 102a and a drain 102b. An extension region 103a and an extension region 103b are provided for the vicinity of a surface of the source 102a on the high-work-function electrode 104 side and for the vicinity of a surface of the drain 102b on the high-work-function electrode 104 side, respectively. The source 102a, the drain 102b, and the extension regions 103a and 103b may have n-type conductivity and the impurity concentrations thereof may be similar to those of a conventional transistor.

The distance between the extension regions 103a and 103b corresponds to the channel length of the transistor. The channel length is preferably twice or more the depth of the extension regions 103a and 103b. This is because when the channel length is less than twice the depth of the extension regions 103a and 103b, an operation of eliminating electrons by the high-work-function electrode 104 does not range to the bottoms of the extension regions 103a and 103b, so that leakage current is generated by electrons flowing through this portion in an OFF state.

P-type halo regions 105a and 105b are provided for the source 102a and the drain 102b at least on the high-work-function electrode 104 side, respectively. A structure as shown in FIG. 1A may be employed in which a periphery of each of the source 102a and the drain 102b is surrounded by any of the extension regions 103a and 103b and the halo regions 105a and 105b and in which the source 102a and the drain 102b are in contact with neither the substrate 101 nor a portion having the same impurity concentration as the substrate 101.

Further, the impurity concentrations of the halo regions 105a and 105b may be similar to those of halo regions of a conventional transistor. For example, the impurity concentrations of the halo regions 105a and 105b may be determined in the range from $1 \times 10^{18}$ cm$^{-3}$ to $1 \times 10^{20}$ cm$^{-3}$ inclusive in consideration of the impurity concentrations of the source 102a and the drain 102b and the channel length.

Figure 4A:
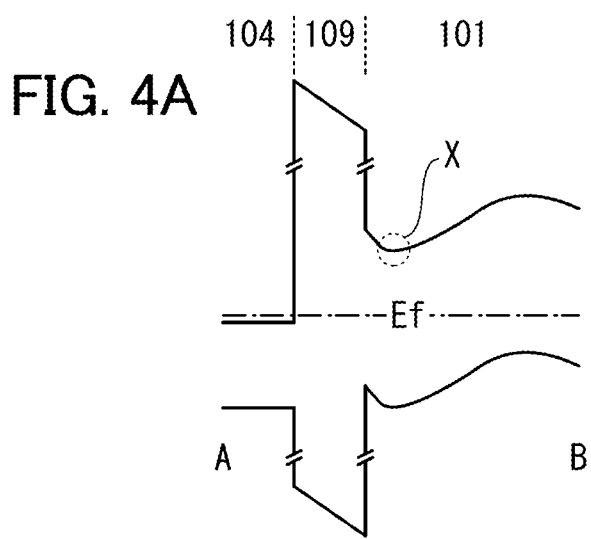
FIGS. 4A to 4C are each for explaining an example of a band condition of a semiconductor device of the present invention.
Figure 4B:
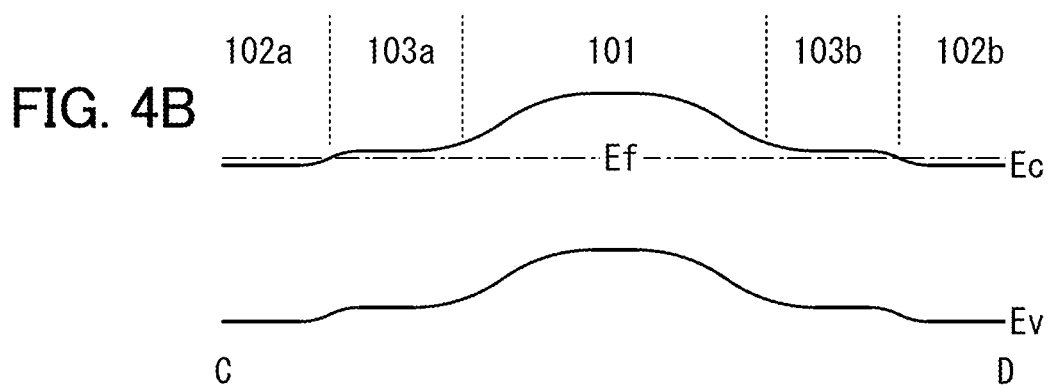
Figure 4C:
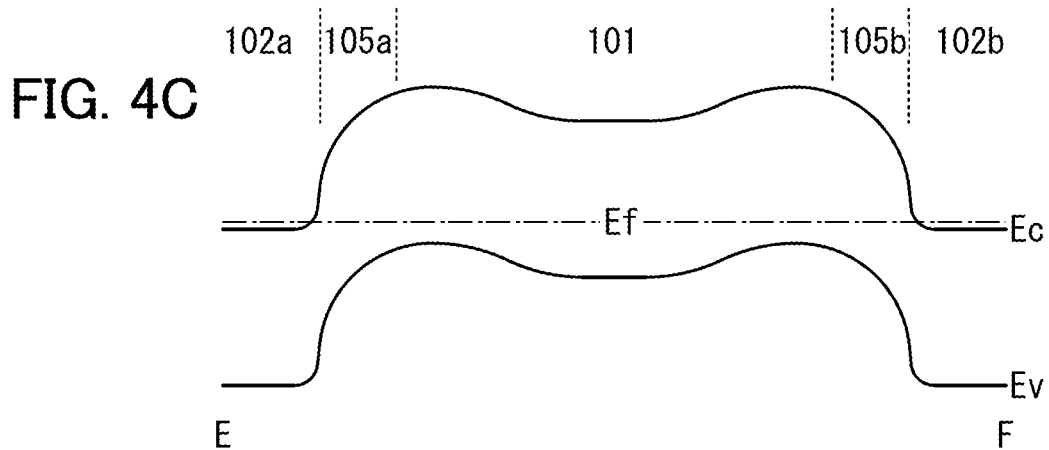

FIG. 1B shows an enlarged center portion of the transistor shown in FIG. 1A. FIGS. 4A, 4B, and 4C show examples of energy band conditions along line AB, line CD, and line EF in FIG. 1B, respectively. Here, it is assumed that the potentials of the high-work-function electrode 104, the source 102a, and the drain 102b are equal to each other. Moreover, Ef represents the Fermi level, Ec represents the bottom of a conduction band, and Ev represents the top of a valence band.

FIG. 4A shows an energy band of a portion from the high-work-function electrode 104 toward the substrate 101 via the gate insulator 109. The substrate 101, which is assumed to have extremely low impurity concentration, come to have p-type conductivity in a portion near point B due to an influence of the halo regions 105a and 105b.

Meanwhile, the vicinity of the gate insulator 109 should have n-type conductivity due to an influence of the extension regions 103a and 103b; however, the type becomes substantially intrinsic due to an influence of the high-work-function electrode 104. If n-type silicon is provided over the gate insulator 109 instead of the high-work-function electrode 104, this portion has n-type conductivity, so that electrons flow through this portion even in an OFF state and the transistor has large leakage current.

Here, attention should be paid to the fact that the bottom of the conduction band is minimal in a part of the substrate 101 which is in the vicinity of the gate insulator 109 (portion indicated by X in FIG. 4A). When a positive potential is given to the high-work-function electrode 104, the bottom of the conduction band approaches the Fermi level and becomes the same level as the source; therefore, a channel is formed there to allow electrons to flow. When a minimal point like X in FIG. 4A exists, electrons preferentially concentrate on that portion.

Since this portion is a little away from the gate insulator 109, there is little influence due to charges trapped at an interface or an interface state between the gate insulator 109 and the substrate 101, charges trapped in the gate insulator 109 itself, or the like, and scattering caused thereby is also little; therefore, high mobility can be achieved.

Note that the energy level of the minimal point X increases or decreases depending on the donor or acceptor concentration of that portion; when the donor concentration is high, the energy level decreases and when the acceptor concentration is high, the energy level increases. Therefore, when the donor concentration is high, the threshold value decreases and when the acceptor concentration is high, the threshold value increases.

FIG. 4B is an energy band diagram of a portion consisting of the source 102a, the extension region 103a, the substrate 101 (and a region having the same impurity concentration as the substrate 101), the extension region 103b, and the drain 102b. Since the center portion becomes substantially intrinsic due to an influence of the high-work-function electrode 104 as aforementioned, an energy barrier is formed between the source 102a and the drain 102b, and conduction between the source 102a and the drain 102b is blocked in an OFF state.

FIG. 4C is an energy band diagram of a portion consisting of the source 102a, the halo region 105a, the substrate 101 (and a region having the same impurity concentration as the substrate 101), the halo region 105b, and the drain 102b. Pn junctions are formed, which form high energy barriers between the source 102a and the halo region 105a and between the drain 102b and the halo region 105b; therefore, conduction between the source 102a and the drain 102b is blocked. An intermediate portion in this region has an impurity concentration as low as that of the substrate 101 but exhibits p-type conductivity due to an influence of the halo regions 105a and 105b.

Figure 3A:
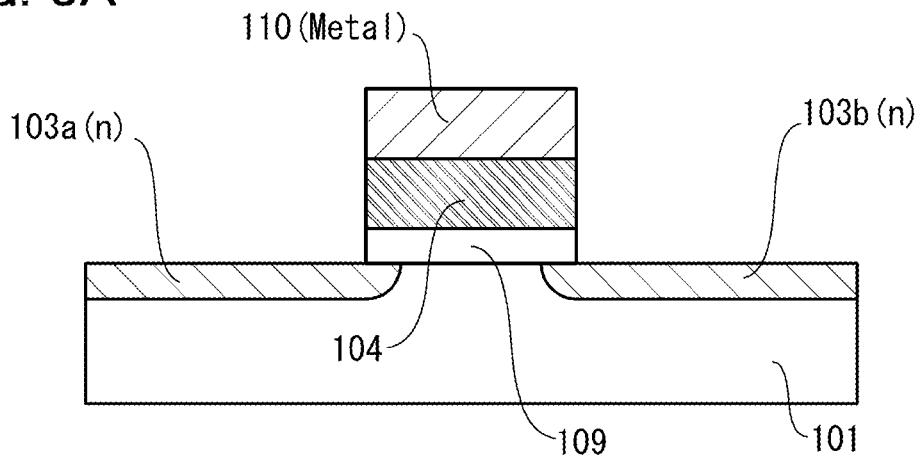
FIGS. 3A to 3C are for explaining an example of a method for manufacturing a semiconductor device of the present invention.

An example of a method for manufacturing the transistor shown in FIG. 1A is briefly explained with reference to FIGS. 3A to 3C. Many steps can be performed in accordance with known semiconductor techniques; therefore, as for the details, the known techniques can be used as a reference. First, the gate insulator 109 is formed over the (100) plane of a p-type high-resistant single-crystal silicon substrate 101. As the gate insulator 109, for example, a stacked-layer film (with a thickness of 2 nm to 10 nm) including a silicon oxynitride film with a thickness of 0.5 nm to 2 nm obtained by thermal oxidation and a hafnium oxide silicate film with a thickness of 1 nm to 5 nm obtained by an atomic layer deposition (ALD) method may be used.

After that, an oxynitride film with high work function (hereinafter referred to as a high-work-function oxynitride film) such as zinc oxynitride, indium oxynitride, tin oxynitride, indium-zinc oxynitride, or indium-zinc-gallium oxynitride (composition formula: $In_aGa_bZn_cO_dN_e$ ($0 \leq a \leq 1$, $0 \leq b \leq 1$, $0 \leq c \leq 1$, $0 \leq d \leq 1$, $0 \leq e \leq 1$)) is formed by a reactive sputtering method.

For example, in order to form zinc oxynitride, a condition in which zinc oxide is a target and the nitrogen concentration is 50% or more and the oxygen concentration is 5% or less in an atmosphere may be employed. In a similar manner, in order to form indium oxynitride, tin oxynitride, indium-zinc oxynitride, or indium-zinc-gallium oxynitride, the nitrogen concentration may be 50% or more and the oxygen concentration may be 5% or less in the atmosphere, and indium oxide, tin oxide, indium-zinc oxide, or indium-zinc-gallium oxide may be used as the target, respectively.

In that case, the substrate temperature may be set in the range from 100° C. to 600° C., preferably 150° C. to 450° C. After the film formation, thermal treatment may be performed under a non-oxidization atmosphere at 100° C. to 600° C., preferably 150° C. to 450° C.

Note that an ALD method or a CVD method (such as an MOCVD method) may be employed other than a sputtering method. In particular, in a case where the gate insulator 109 has a thickness of 5 nm or less, the use of an ALD method or a CVD method which gives less damage on the substrate is preferable.

The high-work-function oxynitride film may have a thickness of 5 nm to 100 nm. When the thickness is less than 5 nm, the work function does not affect a surface of the substrate 101; when the thickness is more than 100 nm, the resistance of the high-work-function oxynitride film becomes high, which is not preferable for the characteristics of circuits. As above, the defect levels in the vicinity of the interface serve as donors in the high-work-function oxynitride film; therefore, in a portion which is far from the interface, the donor concentration decreases and the conductivity remarkably deteriorates. In order to keep the conductivity, additional doping with donors is necessary.

It is known that an example of indium-zinc-gallium oxide represented by the composition formula $InGaZnO_4$ has a crystal structure called a YbFe$_2$O$_4$ structure (see Non-Patent Document 4). However, for example, when 5 at. % or more of nitrogen is added, the wurtzite type structure becomes a stable phase; accordingly, the electron state drastically changes. Since the wurtzite structure is crystallized more easily than the YbFe$_2$O$_4$ structure, the crystallization is performed at relatively low temperature.

As for the electron state, for example, the YbFe$_2$O$_4$ structure has a band gap of approximately 3.2 eV while the wurtzite structure has a band gap of 2.2 eV or less. As for the electron affinity, that of the former is approximately 4.3 eV, while that of the latter is 5.5 eV or more. Since the electron affinity is more than 4.9 eV, the n-type conductivity is exhibited due to the defect levels. Since hydrogen functions as a donor, the carrier concentration can be increased by adding hydrogen.

It is preferable that the high-work-function oxynitride film contains oxygen 2 to 5 times as much as nitrogen besides nitrogen, zinc, tin, and indium, because the generation of trap levels at the interface with the gate insulator can be suppressed. Moreover, it is preferable that the high-work-function oxynitride film contains 1 at. % to 10 at. % of hydrogen because the state of the interface is improved and the carriers are increased to improve the conductivity. Other than in the film formation step, the addition of hydrogen to the high-work-function oxynitride film can be performed in hydrogenation treatment after the completion of a doping step.

Instead of indium-zinc-gallium oxide (In—Ga—Zn—O), a binary metal oxide such as In—Sn—O, Sn—Zn—O, Al—Zn—O, or In—Ga—O; a tertiary metal oxide such as In—Sn—Zn—O, In—Al—Zn—O, Sn—Ga—Zn—O, Al—Ga—Zn—O, Sn—Al—Zn—O, In—Hf—Zn—O, In—Ti—Zn—O, In—Zr—Zn—O, In—La—Zn—O, In—Ce—Zn—O, In—Pr—Zn—O, In—Nd—Zn—O, In—Sm—Zn—O, In—Eu—Zn—O, In—Gd—Zn—O, In—Tb—Zn—O, In—Dy—Zn—O, In—Ho—Zn—O, In—Er—Zn—O, In—Tm—Zn—O, In—Yb—Zn—O, or In—Lu—Zn—O; a quaternary metal oxide such as In—Sn—Ga—Zn—O, In—Hf—Ga—Zn—O, In—Al—Ga—Zn—O, In—Sn—Al—Zn—O, In—Sn—Hf—Zn—O, or In—Hf—Al—Zn—O; or the like may be used. For example, In—Ga—Zn—O means an oxide containing indium (In), gallium (Ga), and zinc (Zn).

After that, a metal film or a metal compound film with high conductivity is formed with an appropriate thickness. For the metal film, aluminum, titanium, tantalum, tungsten, or the like or an alloy containing any of these by 50% or more can be used. For the metal compound film, a nitride film containing any of these can be used.

Then, the metal film or the metal compound film, and the high-work-function oxynitride film are processed into necessary shapes, whereby a gate including the high-work-function electrode 104 and a metal wiring 110 is formed. Further, the extension regions 103a and 103b are formed using these in a self-aligned manner (see FIG. 3A).

Figure 3B:
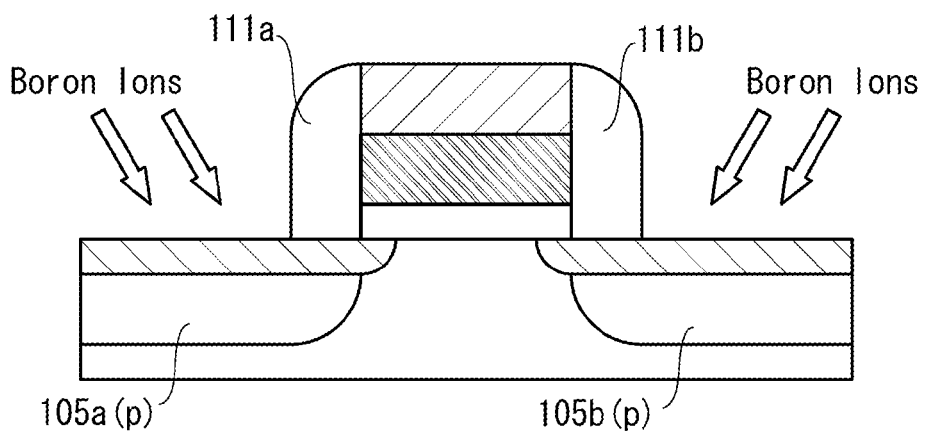
Figure 3C:
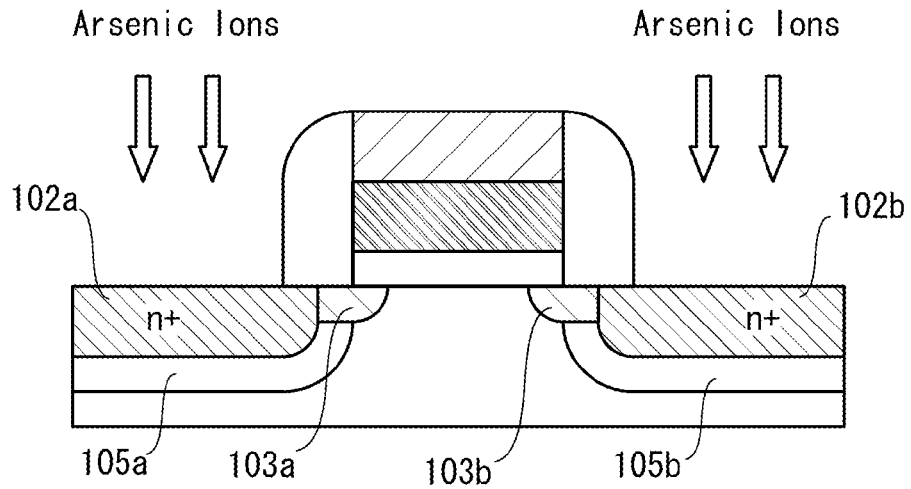

Next, side faces of the gate including the high-work-function electrode 104 and the metal wiring 110 are provided with side walls 111a and 111b, and the halo regions 105a and 105b are formed by an oblique ion implantation method in which boron ions (including boron hydride ions or the like) are used (see FIG. 3B). At this time, the concentration of boron ions is preferably the highest in the vicinity of bottoms of the extension regions 103a and 103b.

In consideration of the excellent diffusing property of boron (especially the above transient enhanced diffusion characteristic), a general method in which ions are implanted vertically may be used for forming the necessary halo regions 105a and 105b. When the ions are implanted vertically, the concentration of boron implanted to the center portion of the channel region can be decreased further.

It is preferable that the peripheries of the extension regions 103a and 103b be not covered with the halo regions 105a and 105b. This is because when the peripheries of the extension regions 103a and 103b are covered with the halo regions 105a and 105b (for example, the state shown in FIG. 2A), carriers passing between the source and the drain need to go through the halo regions.

The relation between the extension regions 103a and 103b and the halo regions 105a and 105b is preferably as described above in order to increase the reliability of the transistor because ions do not pass through the gate insulator 109 over the channel region when the halo regions 105a and 105b are formed, so that the trap levels and the like are not formed for the gate insulator 109.

After that, n-type impurities such as arsenic ions or the like are implanted to form the source 102a and the drain 102b. On this occasion, the boron ions which have been previously implanted for forming the halo regions 105a and 105b to the portion where the source 102a and the drain 102b are formed are removed from that portion due to this ion implantation and the boron ions are accumulated at high concentration in a portion of the halo regions 105a and 105b which is near a boundary with the source 102a and the drain 102b.

Through the above steps, main elements of the transistor are formed. After that, a siliciding process, formation of multilayer wirings and electrodes, hydrogenation treatment, and the like may be performed in accordance with known semiconductor fabrication techniques.

Embodiment 2

FIG. 1C shows Embodiment 2. Embodiment 2 is a transistor manufactured over an insulating surface, according to an aspect of the present invention. The transistor is manufactured using an SOI substrate in which a buried insulator 107 having a thickness of 50 nm or more is provided over the substrate 101 of a single-crystal semiconductor and an SOI layer 106 having a thickness of 50 nm or more is provided thereover. The gate insulator 109 is formed with an appropriate thickness over the SOI layer 106, and the high-work-function electrode 104 including a high-work-function compound semiconductor with a thickness of 5 nm or more and 100 nm or less is provided in contact with the gate insulator 109.

The SOI layer 106 is provided with the source 102a and the drain 102b. The extension region 103a and the extension region 103b are provided for the vicinity of a surface of the source 102a on the high-work-function electrode 104 side and for the vicinity of a surface of the drain 102b on the high-work-function electrode 104 side, respectively. The source 102a, the drain 102b, and the extension regions 103a and 103b may have n-type conductivity and their impurity concentrations may be similar to those of a conventional transistor. The distance between the extension regions 103a and 103b is preferably twice the depth of the extension regions 103a and 103b or more.

The p-type halo regions 105a and 105b are provided between the extension region 103a and the buried insulator 107 and between the extension region 103b and the buried insulator 107, respectively and the periphery of each of the source 102a and the drain 102b is surrounded by any of the extension regions 103a and 103b and the halo regions 105a and 105b.

The impurity concentrations of the halo regions 105a and 105b may be set similar to those of halo regions of a conventional transistor. For example, the impurity concentration of each of the halo regions 105a and 105b may be determined in the range from $1\times10^{18}$ cm$^{-3}$ to $1\times10^{20}$ cm$^{-3}$ inclusive in consideration of the impurity concentrations of the source 102a and the drain 102b and the channel length.

The SOI layer is provided with a low-concentration impurity region 108 which also serves as a channel region. The low-concentration impurity region 108 has p-type conductivity and has an impurity concentration of $1\times10^{18}$ cm$^{-3}$ or less, preferably $1\times10^{17}$ cm$^{-3}$ or less, and more preferably $1\times10^{15}$ cm$^{-3}$ or less. In the case where the impurity concentration is $1\times10^{15}$ cm$^{-3}$ or less, the low-concentration impurity region 108 may have n-type conductivity.

As shown in FIG. 1C, a periphery of the low-concentration impurity region 108 is surrounded by any of the extension regions 103a and 103b and the halo regions 105a and 105b, so that the low-concentration impurity region 108 is not in contact with the source 102a or the drain 102b. With the SOI structure, the punch-through current between the source 102a and the drain 102b can be decreased and the ratio between the on-state current and the off-state current can be increased.

Embodiment 3

Embodiment 3 will be described with reference to FIGS. 5A to 5C. Embodiment 3 will describe a method for manufacturing a transistor which is formed using an SOI layer and which includes an n-type shallow impurity region 112 in a channel region. As described above, by changing the conductivity type or the impurity concentration of the channel region, the threshold value of the transistor can be changed. For the details of the manufacturing steps below, Embodiment 1 and/or known semiconductor fabrication techniques may be used as a reference.

First, an SOI substrate having the buried insulator 107 and the SOI layer 106 over the substrate 101 is prepared. The thickness of each of the buried insulator 107 and the SOI layer 106 is not particularly limited; however, it is preferable that the buried insulator 107 have a thickness of 50 nm or more and the SOI layer 106 have a thickness of 50 nm or more in consideration of the mass productivity. Then, a part of the SOI layer 106 having a thickness of 5 nm to 20 nm from a surface thereof is doped with arsenic at a concentration of $1\times10^{16}$ cm$^{-3}$ to $1\times10^{18}$ cm$^{-3}$, whereby the n-type shallow impurity region 112 is formed (see FIG. 5A).

The n-type shallow impurity region 112 is preferably shallower than each of the extension regions 103a and 103b which are later formed. The concentration of the n-type shallow impurity region 112 may be determined depending on the targeted threshold value.

After that, the gate insulator 109, the high-work-function electrode 104, and the metal wiring 110 are formed, and by using these, the extension regions 103a and 103b are then formed. Further, the sidewalls 111a and 111b are formed and the halo regions 105a and 105b are formed (see FIG. 5B).

Figure 5A:
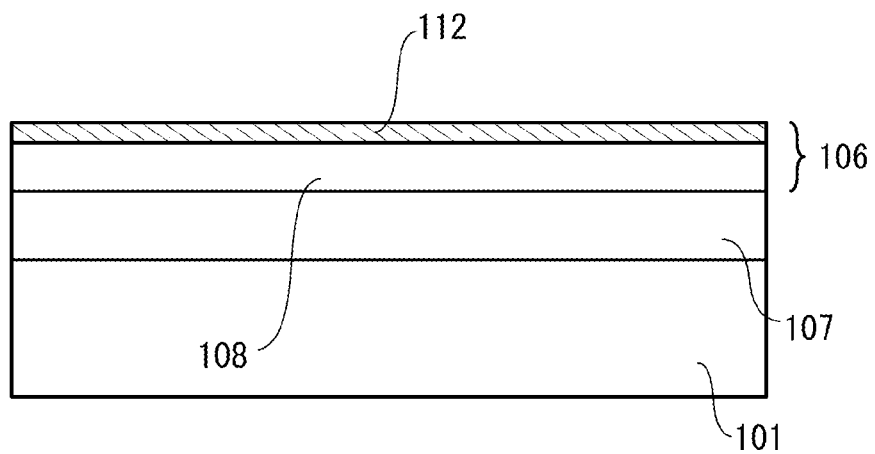
FIGS. 5A to 5C are for explaining an example of a method for manufacturing a semiconductor device of the present invention.
Figure 5B:
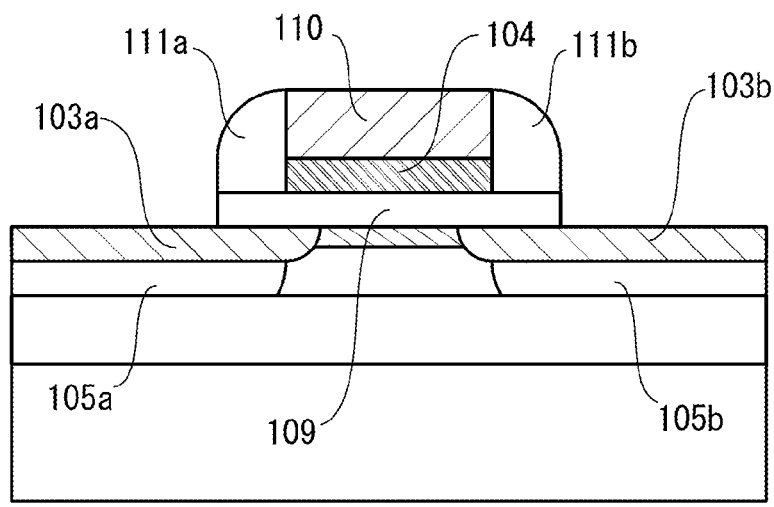
Figure 5C:
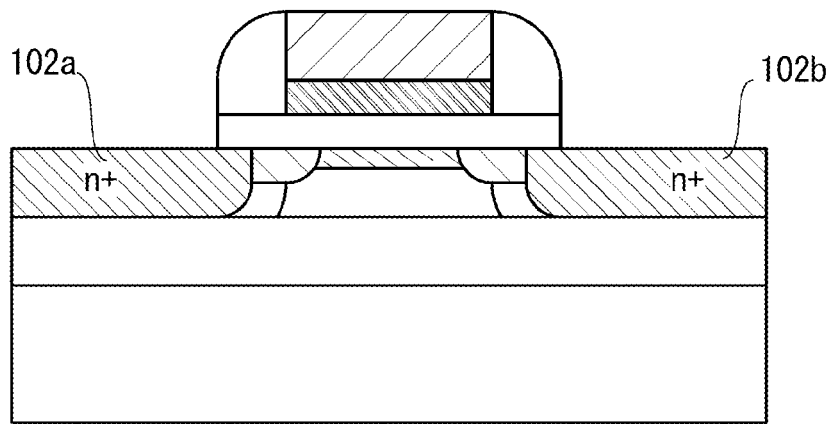

Moreover, the source 102a and the drain 102b are formed (see FIG. 5C). Through the above steps, main elements of the transistor are formed. After that, a siliciding process, formation of multilayer wirings and electrodes, hydrogenation treatment, and the like may be performed in accordance with known semiconductor fabrication techniques.

In Embodiment 3, a surface of the channel region is provided with the n-type shallow impurity region 112. When a gate is n-type silicon, this structure causes a so-called normally-ON characteristic. However, since the high-work-function electrode 104 is used for the gate in Embodiment 3, the n-type shallow impurity region 112 is depleted, whereby the characteristic becomes a normally-OFF characteristic.

In an ON state, a minimal point as indicated by X in FIG. 4A is generated at a place away from the gate insulator 109 and current mainly flows through this part; therefore, there is little influence of charges trapped at an interface or an interface state between the gate insulator 109 and the substrate 101, charges trapped by the gate insulator 109 itself, or the like and scattering caused thereby is also little, whereby high mobility is obtained.

The threshold value of the transistor of Embodiment 3 can be +0.3 V to +1.1 V although depending on the concentration of arsenic to be added by the doping and on the depth of the doping in the step of FIG. 5A.

Embodiment 4

In Embodiment 4, a configuration of a central processing unit (CPU) according to an aspect of the present invention will be described. The CPU described in Embodiment 4 is manufactured using an integrated circuit including the transistor described in Embodiments 1 to 3.

Figure 6:
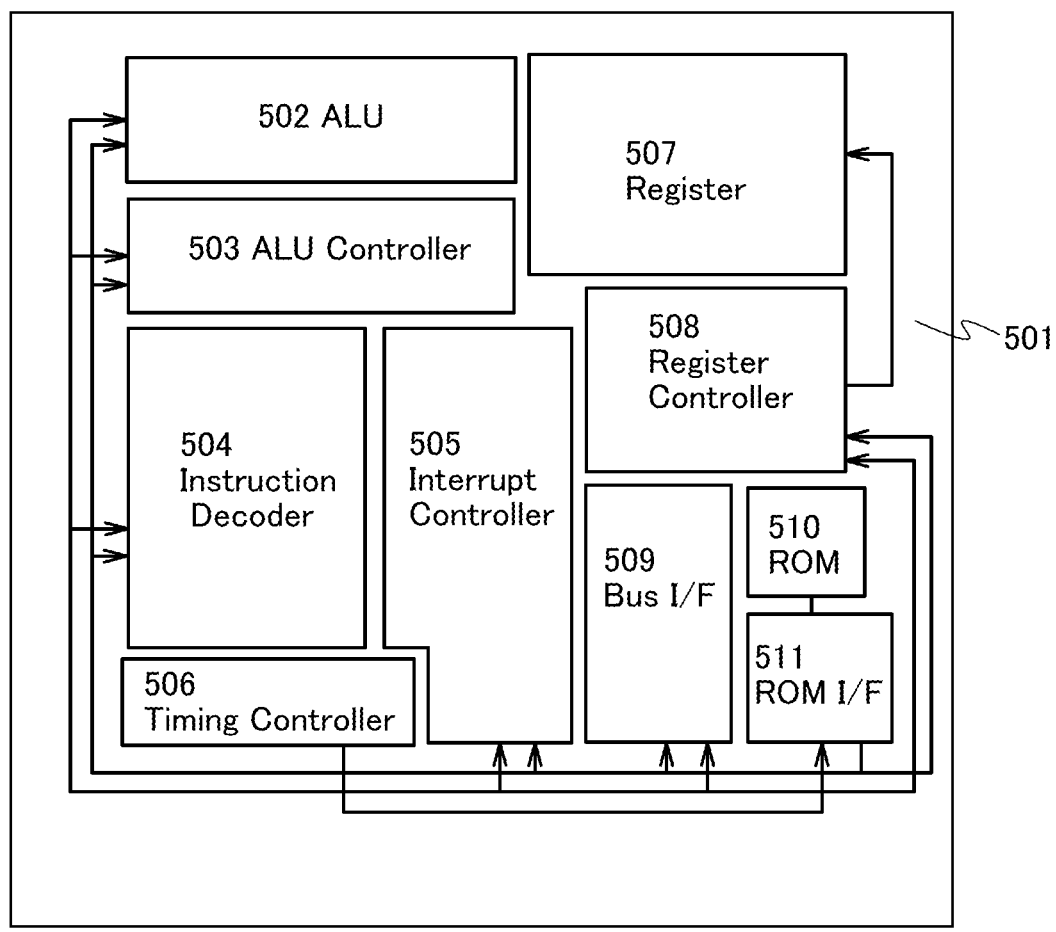
FIG. 6 is a block diagram of a CPU.

FIG. 6 shows a structure of the CPU of Embodiment 4. The CPU illustrated in FIG. 6 mainly includes an arithmetic logic unit (ALU) 502, an ALU controller 503, an instruction decoder 504, an interruption controller 505, a timing controller 506, a register 507, a register controller 508, a bus interface 509, a rewritable ROM 510, and a ROM interface 511 over a substrate 501. The ROM 510 and the ROM interface 511 may be provided for other chips. Obviously, the CPU shown in FIG. 6 is just an example in which the configuration has been simplified, and an actual CPU may have various configurations depending on the application.

An instruction input to the CPU via the bus interface 509 is input to the instruction decoder 504 and decoded therein; after that the decoded instruction is input to the ALU controller 503, the interruption controller 505, the register controller 508, and the timing controller 506.

Based on the decoded instruction, the ALU controller 503, the interruption controller 505, the register controller 508, and the timing controller 506 perform various controls. Specifically, the ALU controller 503 generates a signal for controlling the operation of the ALU 502. The interruption controller 505 processes an interruption request from an external input and output device or a peripheral circuit based on the priority or mask condition during the execution of a program of the CPU. The register controller 508 generates an address of the register 507 and reads out or writes in the register 507 in accordance with the state of the CPU.

The timing controller 506 generates a signal for controlling the timing of the operation of the ALU 502, the ALU controller 503, the instruction decoder 504, the interruption controller 505, and the register controller 508. For example, the timing controller 506 is provided with an internal clock generator for generating an internal clock signal based on a reference clock signal, and supplies the clock signal to the above various circuits.

Although the CPU is given as an example in Embodiment 4, the semiconductor device of the present invention is not limited to be applied to the CPU, but can be applied to an LSI such as a DSP, a custom LSI, or a field progammable gate array (FPGA). Embodiment 4 can be implemented by being combined as appropriate with any of the above-described Embodiments.

Embodiment 5

With the use of a transistor according to an aspect of the present invention, a semiconductor integrated circuit with a high degree of integration, an electronic appliance with high reliability, or an electronic appliance with low power consumption can be provided. Specifically, the transistor according to an aspect of the present invention can be applied to any of image display devices, personal computers, or image reproducing devices provided with recording media (typically devices which reproduce the content of recording media such as DVDs (digital versatile disc) and have displays for displaying the reproduced images).

Other than the above, as an electronic appliance which can be provided with the semiconductor device according to an aspect of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic appliances are shown in FIGS. 7A to 7D.

Figure 7A:
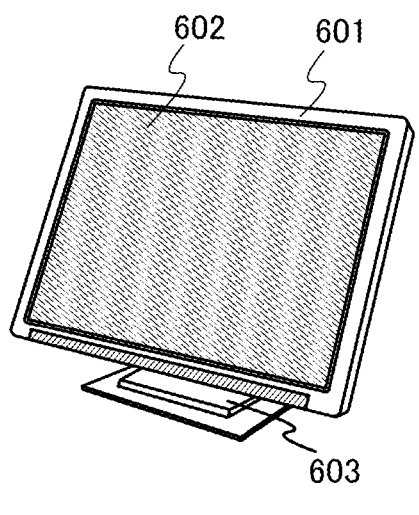
FIGS. 7A to 7D show electronic appliances.

FIG. 7A shows a display device including a housing 601, a display portion 602, a supporting stand 603, and the like. The transistor according to an aspect of the present invention can be used for an integrated circuit for controlling the driving of the display device. With the use of the transistor according to an aspect of the present invention for the integrated circuit, the display device has high reliability and consumes less power. Note that the category of the display device includes all the display devices for displaying information, such as display devices for a personal computer, TV broadcast reception, advertisement display, and the like.

Figure 7B:
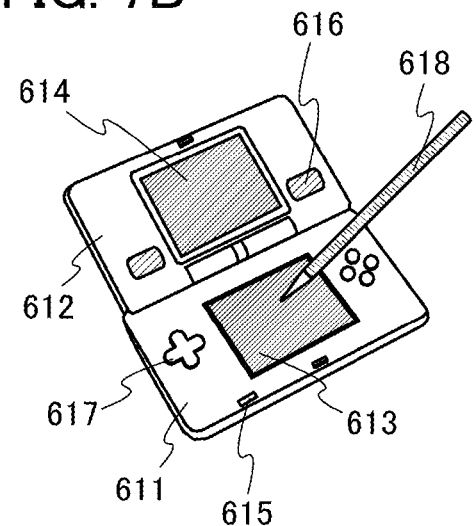

FIG. 7B shows a portable game machine including a housing 611, a housing 612, a display portion 613, a display portion 614, a microphone 615, a speaker 616, an operation key 617, a stylus 618, and the like. The transistor according to an aspect of the present invention can be used for an integrated circuit for controlling the driving of the portable game machine. With the use of the transistor according to an aspect of the present invention for the integrated circuit for controlling the driving of the portable game machine, the portable game machine has high reliability and consumes less power. Although the portable game machine illustrated in FIG. 7B includes the two display portions 613 and 614, the number of display portions included in the portable game machine is not limited to two.

Figure 7C:
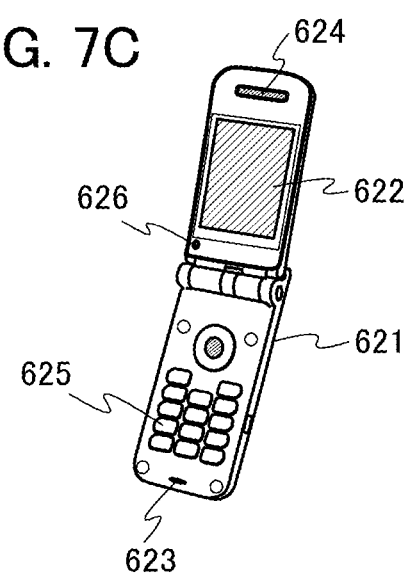

FIG. 7C shows a mobile phone including a housing 621, a display portion 622, an audio input portion 623, an audio output portion 624, operation keys 625, a light receiving portion 626, and the like. Light received in the light-receiving portion 626 is converted into electrical signals, whereby an outside image can be downloaded. The transistor according to an aspect of the present invention can be used for an integrated circuit for controlling the driving of the mobile phone. With the use of the transistor according to an aspect of the present invention for the integrated circuit for driving the mobile phone, the mobile phone has high reliability and consumes less power.

Figure 7D:
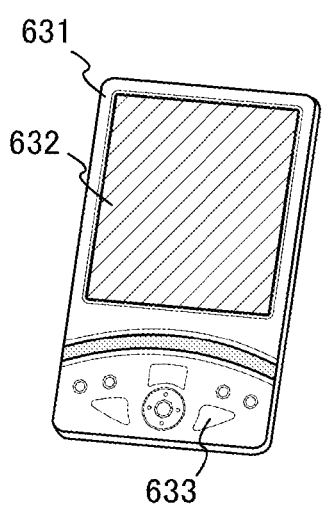

FIG. 7D shows a portable information terminal including a housing 631, a display portion 632, an operation key 633, and the like. In the portable information terminal illustrated in FIG. 7D, a modem may be incorporated in the housing 631. The transistor according to an aspect of the present invention can be used for an integrated circuit for controlling the driving of the portable information terminal. With the use of the transistor according to an aspect of the present invention for the integrated circuit, the portable information terminal has high reliability and consumes less power.

Embodiment 5 can be implemented by being combined as appropriate with any of the above-described Embodiments.

This application is based on Japanese Patent Application serial no. 2010-274262 filed with Japan Patent Office on Dec. 9, 2010, the entire contents of which are hereby incorporated by reference.

What is claimed is:

1. A semiconductor device comprising:
   a channel region;
   a gate insulator over the channel region, and
   an n-type semiconductor provided on and in contact with the gate insulator,
   wherein a concentration of donors and acceptors in the channel region is less than $1 \times 10^{-3}$ nm$^{-3}$,
   wherein a channel length of the semiconductor device is 100 nm or less,
   wherein the n-type semiconductor contains oxygen, nitrogen and one selected from the group consisting of indium, tin, and zinc,
   wherein the contained oxygen is 2 to 5 times of the contained nitrogen,
   wherein the n-type semiconductor comprises crystals having a wurtzite-type crystal structure,
   wherein the n-type semiconductor has a work function of 5.5 eV or more, and
   wherein a relation of $N_d^{1/2} \times t_{ox} \times L < 1$ [nm$^{1/2}$] is satisfied where $N_d$ [nm$^{-3}$] is the concentration of donors and acceptors in the channel region, $t_{ox}$ [nm] is a thickness of the gate insulator when it is assumed as silicon oxide, and L [nm] is the channel length.

2. The semiconductor device according to claim 1, wherein the channel region comprises silicon.

3. The semiconductor device according to claim 1, further comprising an extension region and a halo region,
   wherein the extension region is provided in contact with the channel region and the halo region.

4. A semiconductor device comprising an n-type transistor, the n-type transistor comprising:
   a channel region;
   a gate insulator over the channel region;
   two extension regions provided in contact with the channel region;
   a source;
   a drain;
   two halo regions; and
   an n-type semiconductor provided on and in contact with the gate insulator,
   wherein the n-type semiconductor contains oxygen, nitrogen and one selected from the group consisting of indium, tin, and zinc,
   wherein the contained oxygen is 2 to 5 times of the contained nitrogen,
   wherein the n-type semiconductor comprises crystals having a wurtzite-type crystal structure,
   wherein the n-type semiconductor has a work function of 5.5 eV or more,
   wherein one of the halo regions is provided in contact with one of the extension regions and one of the source and the drain,
   wherein the channel region contains an n-type shallow impurity region provided in contact with the gate insulator and both of the two extension regions,
   wherein the channel region contains a low-concentration impurity region having a p-type conductivity provided in contact with the n-type shallow impurity region and both of the two extension regions, and wherein the n-type transistor shows normally-off characteristics.

5. The semiconductor device according to claim 4, wherein the channel region comprises silicon.

6. The semiconductor device according to claim 4, wherein the carrier concentration of the n-type semiconductor is $1\times10^{20}$ cm$^{-3}$ or more.

7. The semiconductor device according to claim 4, wherein a distance between the extension regions is 100 nm or less.

8. The semiconductor device according to claim 4, wherein the n-type shallow impurity region is shallower than each of the extension regions.

9. A semiconductor device comprising an n-type transistor, the n-type transistor comprising:
a single crystal semiconductor region;
a gate insulator over the single crystal semiconductor region;
two extension regions provided in contact with the single crystal semiconductor region;
a source;
a drain;
two halo regions; and
an n-type semiconductor provided on and in contact with the gate insulator,
wherein a distance between the two extension regions is 100 nm or less,
wherein the n-type semiconductor contains oxygen, nitrogen and one selected from the group consisting of indium, tin, and zinc,
wherein the contained oxygen is 2 to 5 times of the contained nitrogen,
wherein the n-type semiconductor comprises crystals having a wurtzite-type crystal structure,
wherein the n-type semiconductor has a work function of 5.5 eV or more,
wherein each of the two halo regions is provided in contact with one of the two extension regions and one of the source and the drain,
wherein a concentration of impurities of the single crystal semiconductor region is $1\times10^{15}$ cm$^{-3}$ or less, and
wherein each of the source and the drain is not in contact with the single crystal semiconductor region.

10. The semiconductor device according to claim 9, wherein the single crystal semiconductor region comprises a single crystal silicon.

11. The semiconductor device according to claim 9, wherein the carrier concentration of the n-type semiconductor is $1\times10^{20}$ cm$^{-3}$ or more.

12. The semiconductor device according to claim 9, wherein each of the source and the drain is entirely surrounded by one of the two halo regions and by one of the two extension regions.

13. A semiconductor device comprising:
a single crystal semiconductor region;
a gate insulator over the single crystal semiconductor region, and
an n-type semiconductor provided on and in contact with the gate insulator,
wherein a concentration of donors and acceptors in the single crystal semiconductor region is less than $1\times10^{-3}$ nm$^{-3}$,
wherein a channel length of the semiconductor device is 100 nm or less,
wherein the n-type semiconductor contains oxygen, nitrogen and one selected from the group consisting of indium, tin, and zinc,
wherein the contained oxygen is 2 to 5 times of the contained nitrogen,
wherein the n-type semiconductor comprises crystals having a wurtzite-type crystal structure,
wherein the n-type semiconductor has a work function of 5.5 eV or more, and
wherein a relation of $N_d^{1/2} \times t_{ox} \times L < 1$ [nm$^{1/2}$] is satisfied where $N_d$ [nm$^{-3}$] is the concentration of donors and acceptors in the single crystal semiconductor region, $t_{ox}$ [nm] is a thickness of the gate insulator when it is assumed as silicon oxide, and L [nm] is the channel length.

14. The semiconductor device according to claim 13, wherein the single crystal semiconductor region comprises a single crystal silicon.

15. The semiconductor device according to claim 13, further comprising an extension region and a halo region,
wherein the extension region is provided in contact with the single crystal semiconductor region and the halo region.

* * * * *

UNITED STATES PATENT AND TRADEMARK OFFICE
CERTIFICATE OF CORRECTION

PATENT NO. : 8,957,462 B2  
APPLICATION NO. : 13/314326  
DATED : February 17, 2015  
INVENTOR(S) : Shunpei Yamazaki, Hiromichi Godo and Yasuhiko Takemura Page 1 of 1

It is certified that error appears in the above-identified patent and that said Letters Patent is hereby corrected as shown below:

Specification

Column 3, line 66, after "Engineering" replace "Or" with --For--;

Column 16, line 59, replace "progammable" with --programmable--;

Column 17, line 63, replace "modern" with --modem--; and

Claims

Column 19, line 42, claim 9, replace "cm~3" with --$cm^{-3}$--.

Signed and Sealed this  
Tenth Day of November, 2015

Michelle K. Lee  
*Director of the United States Patent and Trademark Office*